United States Patent
Murata et al.

(10) Patent No.: US 10,882,697 B2
(45) Date of Patent: Jan. 5, 2021

(54) STORAGE APPARATUS AND STORAGE METHOD

(71) Applicant: MURATA MACHINERY, LTD., Kyoto (JP)

(72) Inventors: Masanao Murata, Ise (JP); Tadamasa Tominaga, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 177 days.

(21) Appl. No.: 15/755,131

(22) PCT Filed: Jul. 4, 2016

(86) PCT No.: PCT/JP2016/069770
§ 371 (c)(1),
(2) Date: Feb. 26, 2018

(87) PCT Pub. No.: WO2017/038237
PCT Pub. Date: Mar. 9, 2017

(65) Prior Publication Data
US 2018/0244470 A1 Aug. 30, 2018

(30) Foreign Application Priority Data
Aug. 28, 2015 (JP) ................................ 2015-168594

(51) Int. Cl.
*H01L 21/677* (2006.01)
*B65G 1/14* (2006.01)
*H01L 21/673* (2006.01)

(52) U.S. Cl.
CPC .......... *B65G 1/14* (2013.01); *H01L 21/67389* (2013.01); *H01L 21/67769* (2013.01); *H01L 21/67793* (2013.01)

(58) Field of Classification Search
CPC ......... H01L 21/67389; H01L 21/67769; H01L 21/67793
See application file for complete search history.

(56) References Cited

U.S. PATENT DOCUMENTS

| | | | | |
|---|---|---|---|---|
| 7,077,173 | B2 * | 7/2006 | Tokunaga | H01L 21/67017 141/66 |
| 8,240,346 | B2 * | 8/2012 | Goto | H01L 21/67389 141/192 |
| 8,974,167 | B2 * | 3/2015 | Ito | H01L 21/67769 414/217 |
| 9,064,918 | B2 * | 6/2015 | Takahara | H01L 21/67769 |
| 9,199,793 | B2 * | 12/2015 | Takahara | B65G 1/16 |
| 9,595,461 | B2 * | 3/2017 | Takahara | F17C 13/02 |

(Continued)

OTHER PUBLICATIONS

Official Communication issued in corresponding European Patent Application No. 16841269.0, dated Apr. 3, 2019.

*Primary Examiner* — Jonathan Snelting
(74) *Attorney, Agent, or Firm* — Keating & Bennett, LLP (57) ABSTRACT

A storage apparatus includes a storage shelf that stores a container, a purge device that is provided to the storage shelf and is able to perform a purge process on the container, and a purge determiner that determines at least one of a necessity of the purge process and a condition of the purge process in accordance with at least one of a transport source of the container to the storage shelf and a transport destination of the container from the storage shelf.

8 Claims, 5 Drawing Sheets

(56) References Cited

U.S. PATENT DOCUMENTS

| | | | |
|---|---|---|---|
| 9,695,509 B2* | 7/2017 | Hirano | H01L 21/67017 |
| 2010/0316471 A1 | 12/2010 | Ito | |
| 2014/0014225 A1 | 1/2014 | Takahara et al. | |
| 2014/0112739 A1 | 4/2014 | Hirano et al. | |
| 2015/0000759 A1 | 1/2015 | Takahara et al. | |
| 2015/0003941 A1 | 1/2015 | Takahara et al. | |

* cited by examiner

| TRANSPORT SOURCE TO STORAGE SHELF | NECESSITY OF PURGE PROCESS |
|---|---|
| LOADING AND UNLOADING PORT | UNNECESSARY |
| LOAD PORT | NECESSARY |

| TRANSPORT DESTINATION FROM STORAGE SHELF | NECESSITY OF PURGE PROCESS |
|---|---|
| LOADING AND UNLOADING PORT | NECESSARY |
| LOAD PORT | UNNECESSARY |

| TRANSPORT SOURCE TO STORAGE SHELF | CONDITIONS OF PURGE PROCESS | |
|---|---|---|
| | FLOW RATE OF PURGE GAS | SUPPLY TIME |
| LOADING AND UNLOADING PORT | Q1 | T1 |
| LOAD PORT | Q2 | T2 |

| TRANSPORT SOURCE TO STORAGE SHELF | NECESSITY OF PURGE PROCESS | CONDITIONS OF PURGE PROCESS | |
|---|---|---|---|
| | | FLOW RATE OF PURGE GAS | SUPPLY TIME |
| LOADING AND UNLOADING PORT | UNNECESSARY | — | — |
| LOAD PORT | NECESSARY | Q2 | T2 |

STORAGE APPARATUS AND STORAGE METHOD

BACKGROUND OF THE INVENTION

1. Field of the Invention

The present invention relates to a storage apparatus and a storage method.

2. Description of the Related Art

In manufacturing factories for various kinds of devices such as semiconductor devices and liquid crystal devices, various kinds of treatment such as a thin film forming process, an oxidation process, and an etching process are performed on substrates such as silicon wafers and glass wafers to manufacture devices. Between processing devices that perform these processes, articles such as substrates and reticles used for processes are contained in a container and the container is conveyed by a conveyance device. At a place where the container is transferred between the conveyance device and a processing device, a storage apparatus (buffer, stocker) that temporarily stores a container is provided (see, for example, Japanese Patent No. 5083278 below). By temporarily storing a container to be carried out next by the conveyance device in the storage apparatus and/or temporarily storing a container having an article to be processed next by the processing device in the storage apparatus, it is possible to reduce standby times for the conveyance device and the processing device and enhance conveyance efficiency and processing efficiency.

In recent years, various kinds of devices have become integrated at higher density, and even minute defects caused by oxidation and contamination can reduce yields. Thus, requirements for oxidation suppression and contamination suppression have become strict, and it is required that a container be subjected to a purge process in a storage apparatus (for example, storage warehouse). In order to perform a purge process on a container in the storage apparatus, a method of providing a purge device to a storage shelf that stores a container and performing a purge process by a purge device each time a container is placed on the storage shelf is used.

In some cases, a container to be carried in the processing device or a container to be carried out from the processing device does not need to be subjected to a purge process in the storage apparatus. For example, the purge process may be necessary for a container containing an article before being processed by the processing device, but the purge process may be unnecessary for a container containing an article after being processed by the processing device. In contrast, the purge process may be unnecessary for a container containing an article before being processed by the processing device, but the purge process may be necessary for a container containing an article after being processed by the processing device. In such cases, if the purge process is performed when the container is carried in the processing device and when the container is carried out from the processing device, the cost and time necessary for the purge process are wasted.

SUMMARY OF THE INVENTION

In view of the above-mentioned circumstances, preferred embodiments of the present invention provide storage apparatuses and storage methods capable of eliminating an unnecessary purge process while maintaining satisfactory environments in a container.

A storage apparatus according to a preferred embodiment of the present invention includes a storage shelf that stores a container; a purge device that is provided to the storage shelf and is able to perform a purge process on the container; and a purge determiner that determines at least one of a necessity of the purge process and a condition of the purge process in accordance with at least one of a transport source of the container to the storage shelf and a transport destination of the container from the storage shelf.

Furthermore, the storage apparatus may include a loading and unloading device that carries the container into the storage shelf and carries out the container from the storage shelf, and the purge determiner may determine the necessity of the purge process in accordance with a conveyance instruction for the loading and unloading device. Furthermore, the storage apparatus may be provided beside a processing device that processes an article contained in the container, and store, in the storage shelf, the container to be transferred between a transport vehicle port to which the container is transferred from a transport vehicle and a load port in the processing device, and the purge determiner may determine the necessity of the purge process based on the conveyance instruction for the loading and unloading device between the transport vehicle port and the storage shelf or the conveyance instruction for the loading and unloading device between the load port and the storage shelf. Furthermore, when the conveyance instruction is an instruction to convey the container from the transport vehicle port to the storage shelf, the purge determiner may specify the transport source as the transport vehicle port. Furthermore, when the conveyance instruction is an instruction to convey the container from the transport vehicle port to the storage shelf, the purge determiner may specify the transport destination as the load port. Furthermore, when the conveyance instruction is an instruction to convey the container from the load port to the storage shelf, the purge determiner may specify the transport source as the load port. Furthermore, when the conveyance instruction is an instruction to convey the container from the load port to the storage shelf, the purge determiner may specify the transport destination as the transport vehicle port. Furthermore, the purge determiner may collate a result of specifying the transport destination and information in which the transport destination and the necessity of the purge process are associated with each other, and determine the necessity of the purge process. Furthermore, the purge determiner may collate a result of specifying the transport source with information in which the transport source and the necessity of the purge process are associated with each other, and determine the necessity of the purge process.

A storage method according to a preferred embodiment of the present invention includes storing a container on a storage shelf; performing a purge process on the container by a purge device provided to the storage shelf; and determining at least one of a necessity of the purge process and a condition of the purge process in accordance with at least one of a transport source of the container to the storage shelf and a transport destination of the container from the storage shelf.

According to preferred embodiments of the present invention, the necessity of a purge process is determined in accordance with at least one of a transport source of a container to the storage shelf and a transport destination of the container from the storage shelf, and hence it is possible to eliminate an unnecessary purge process while maintaining satisfactory environments in the container. Furthermore, the storage apparatus that includes a loading and unloading device that carries the container into the storage shelf and carries out the container from the storage shelf and in which the purge determiner determines the necessity of the purge process in accordance with a conveyance instruction for the loading and unloading device is able to determine the necessity of the purge process simply and reliably as a result of the use of the conveyance instruction used for operating the loading and unloading device. Furthermore, the storage apparatus that is provided beside a processing device that processes an article contained in the container, that stores, in the storage shelf, the container to be transferred between a transport vehicle port to which the container is transferred from a transport vehicle and a load port in the processing device, and in which the purge determiner determines the necessity of the purge process based on the conveyance instruction for the loading and unloading device between the transport vehicle port and the storage shelf or the conveyance instruction for the loading and unloading device between the load port and the storage shelf is able to specify a transport source and a transport destination reliably and determine the necessity of the purge process simply and reliably because the determination is based on the conveyance instruction between the transport vehicle port or the load port and the storage shelf. Furthermore, the storage apparatus in which, when the conveyance instruction is an instruction to convey the container from the transport vehicle port to the storage shelf, the purge determiner specifies the transport source as the transport vehicle port is able to specify the transport source reliably. Furthermore, the storage apparatus in which, when the conveyance instruction is an instruction to convey the container from the transport vehicle port to the storage shelf, the purge determiner specifies the transport destination as the load port is able to specify the transport destination reliably. Furthermore, the storage apparatus in which, when the conveyance instruction is an instruction to convey the container from the load port to the storage shelf, the purge determiner specifies the transport source as the load port is able to specify the transport source reliably. Furthermore, the storage apparatus in which when the conveyance instruction is an instruction to convey the container from the load port to the storage shelf, the purge determiner specifies the transport destination as the transport vehicle port is able to specify the transport destination reliably. Furthermore, the storage apparatus in which the purge determiner collates a result of specifying the transport destination with reference information in which the transport destination and the necessity of the purge process are associated with each other and determines the necessity of the purge process is able to determine the necessity of the purge process simply and reliably. Furthermore, the storage apparatus in which the purge determiner collates a result of specifying the transport source with reference information in which the transport source and the necessity of the purge process are associated with each other and determines the necessity of the purge process is able to determine the necessity of the purge process simply and reliably.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described below with reference to the drawings. In each of the figures referred to below, an XYZ coordinate system is used to describe the directions in the figure as appropriate. In the XYZ coordinate system, the vertical direction is a Z direction and the horizontal directions are X and Y directions.

Figure 1:
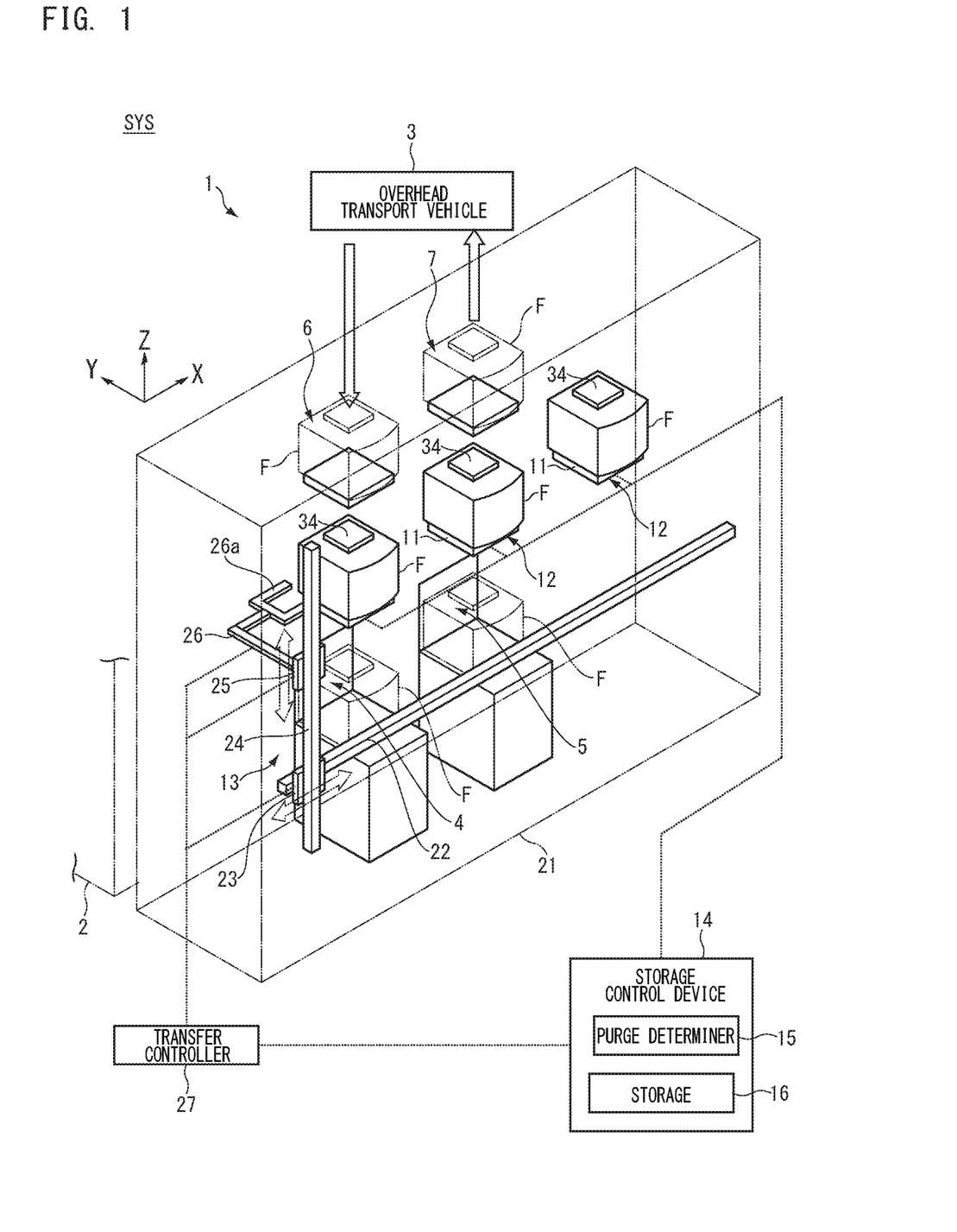
FIG. 1 is a diagram illustrating an example of a manufacturing system to which a storage apparatus according to a preferred embodiment of the present invention is applied.

FIG. 1 is a diagram illustrating an example of a manufacturing system SYS to which a storage apparatus 1 is applied according to a preferred embodiment of the present invention. The manufacturing system SYS manufactures various kinds of devices, including semiconductor devices and liquid crystal devices. For example, the manufacturing system SYS manufactures semiconductor devices by forming structures such as semiconductor elements, wirings, and insulating films on substrates such as silicon wafers. The manufacturing system SYS includes a storage apparatus 1, a processing device 2, and a transport vehicle (overhead transport vehicle 3).

The processing device 2 executes processes of steps to manufacture devices. Examples of the processing device 2 include a film forming device, a coater/developer, an exposure device, and an etching device. A container F containing an article related to processes is carried in and out to and from the processing device 2 through load ports 4 and 5. Examples of the article related to processes include a substrate to be processed and an article (for example, reticle) used for processes. The processing device 2 receives the container F at the load port 4, picks out a substrate contained in the container F, and performs a predetermined process on the substrate. Furthermore, the processing device 2 contains the processed substrate in the container F again, and transfers the container F to the load port 5.

Examples of the overhead transport vehicle 3 include an OHT vehicle. The overhead transport vehicle 3 is movable along a rail (not shown) installed on the ceiling (not shown) of a facility. The overhead transport vehicle 3 moves while holding (for example, gripping) a container F, thus conveying the container F outside the storage apparatus 1. For example, the overhead transport vehicle 3 conveys a container F containing an article related to processes by the processing device 2. Furthermore, the overhead transport vehicle 3 receives a container F containing an article processed by the processing device 2, and conveys the container F to another processing device or the like. The overhead transport vehicle 3 receives and transfers the container F at transport vehicle ports (loading and unloading ports 6 and 7). For example, the overhead transport vehicle 3 transfers a container F to be carried in the processing device 2 at the loading and unloading port 6 (loading port), and receives a container F carried out from the processing device 2 at the loading and unloading port 7 (unloading port).

The storage apparatus 1 is a tool buffer or the like, and is provided beside the processing device 2. The storage apparatus 1 is disposed in a conveyance path between the overhead transport vehicle 3 and the processing device 2. The storage apparatus 1 stores containers F that are transferred between the loading and unloading ports 6 and 7 to which containers F are transferred by the overhead transport vehicle 3 and the load ports 4 and 5 in the processing device 2. The storage apparatus 1 receives a container F when the overhead transport vehicle 3 conveys the container F to the loading and unloading port 6, and temporarily stores the container F until the storage apparatus 1 transfers the container F to the processing device 2. This configuration enables the next container F to be received at the loading and unloading port 6. Furthermore, the storage apparatus 1 temporarily stores a container F carried out from the processing device 2, and when the loading and unloading port 7 is available, transfers the container F to the loading and unloading port 7. This configuration enables the overhead transport vehicle 3 to receive the container F at the loading and unloading port 7. In this manner, by temporarily storing a container F in the storage apparatus 1, the standby time for the overhead transport vehicle 3 is reduced, and conveyance efficiency is increased. Furthermore, the storage apparatus 1 temporarily stores a container F received from the overhead transport vehicle 3, and when the load port 4 in the processing device 2 is available, transfers the container F to the load port 4. This configuration enables the processing device 2 to receive the next container F quickly after the end of the process. Furthermore, when the processing device 2 carries the container F out to the load port 5, the storage apparatus 1 receives the container F and temporarily stores the container F. This configuration enables the processing device 2 to transfer the next container F to the load port 5. In this manner, by temporarily storing a container F in the storage apparatus 1, the standby time for the processing device 2 is reduced, and processing efficiency is increased.

Next, elements of the storage apparatus 1 are described. The storage apparatus 1 includes a storage shelf 11, a purge device (also illustrated in FIG. 2 referred to later) provided to the storage shelf 11, a loading and unloading device (transfer device 13), and a storage control device 14. The storage control device performs overall control of the elements in the storage apparatus 1. In the storage control device 14, a purge determiner 15 and a storage 16 are provided.

The storage shelves 11 are arranged side by side in one stage or two or more stages in the height direction (Z direction), and are arranged side by side in the horizontal direction (X direction). The storage shelves 11 are each supported by a frame 21 of the storage apparatus 1. A container F is placeable on each of the storage shelves 11. The storage shelves 11 are each a shelf capable of holding a container F subjected to a purge process by the purge device 12. The storage apparatus 1 has a structure in which the load ports 4 and 5, the storage shelves 11, and the loading and unloading ports 6 and 7 are arranged in multiple stages in the Z direction. The load ports 4 and 5 are arranged in the bottom stage, the storage shelves 11 are arranged in the middle stage, and the loading and unloading ports 6 and 7 are arranged in the top stage. Note that the number and the arrangement of the storage shelves 11 are not limited, and the number and the arrangement of the storage shelves 11 are freely set.

The transfer device 13 conveys a container F inside the storage apparatus 1 (for example, space surrounded by frame 21). The transfer device 13 is able to convey a container F between the loading and unloading port 6 or 7 and the storage shelf 11 and is able to convey a container F between the load port 4 or 5 and the storage shelf 11. For example, the transfer device 13 carries a container F transferred to the loading and unloading port 6 into the storage shelf 11, and carries the container F out from the storage shelf 11 and transfers the container F to the load port 4. In this case, a transport source of the container F to the storage shelf 11 is the loading and unloading port 6, and a transport destination of the container F from the storage shelf 11 is the load port 4. Furthermore, the transfer device 13 is able to carry a container F transferred to the load port 5 into the storage shelf 11, and carry a container F out from the storage shelf 11 and transfer the container F to the loading and unloading port 7. In this case, a transport source of the container F to the storage shelf 11 is the load port 5, and a transport destination of the container F from the storage shelf 11 is the loading and unloading port 7.

The transfer device 13 includes a horizontal guide 22, a horizontal slider 23, a vertical guide 24, a vertical slider 25, an arm 26, and a transfer controller 27. The horizontal guide 22 is mounted to the frame 21 and extends in the X direction. The horizontal slider 23 is able to move in the X direction along the horizontal guide 22. The vertical guide 24 is mounted to the horizontal slider 23 and extends in the Z direction. When the horizontal slider 23 moves, the vertical guide 24 moves in the X direction together with the horizontal slider 23. The vertical slider 25 is able to move in the Z direction along the vertical guide 24. The arm 26 is mounted to the vertical slider 25. When the horizontal slider 23 moves, the arm 26 moves in the X direction together with the horizontal slider 23 and the vertical slider 25. Furthermore, when the vertical slider 25 moves, the arm 26 moves in the Z direction together with the vertical slider 25. The arm 26 is a robot arm including one or two or more articulations, and has a U-shaped grip 26a on its distal end side. For example, the arm 26 is able to move the grip 26a in the X direction and the Y direction by expansion and contraction of articulations. The grip 26a is inserted under a flange 34 (also illustrated in FIG. 2 referred to later) of the container F to grip the container F. The arm 26 is able to move the container F in the X direction and in the Y direction in a manner that the articulations are expanded or contracted while the container F is gripped by the grip 26a. Note that the container F may be moved in the X direction by the movement of the horizontal slider 23. Furthermore, the transfer device 13 is able to move the container F in the X direction and the Z direction by the movement of the horizontal slider 23 and the movement of the vertical slider 25 in the state in which the container F is gripped by the grip 26a.

Figure 3:
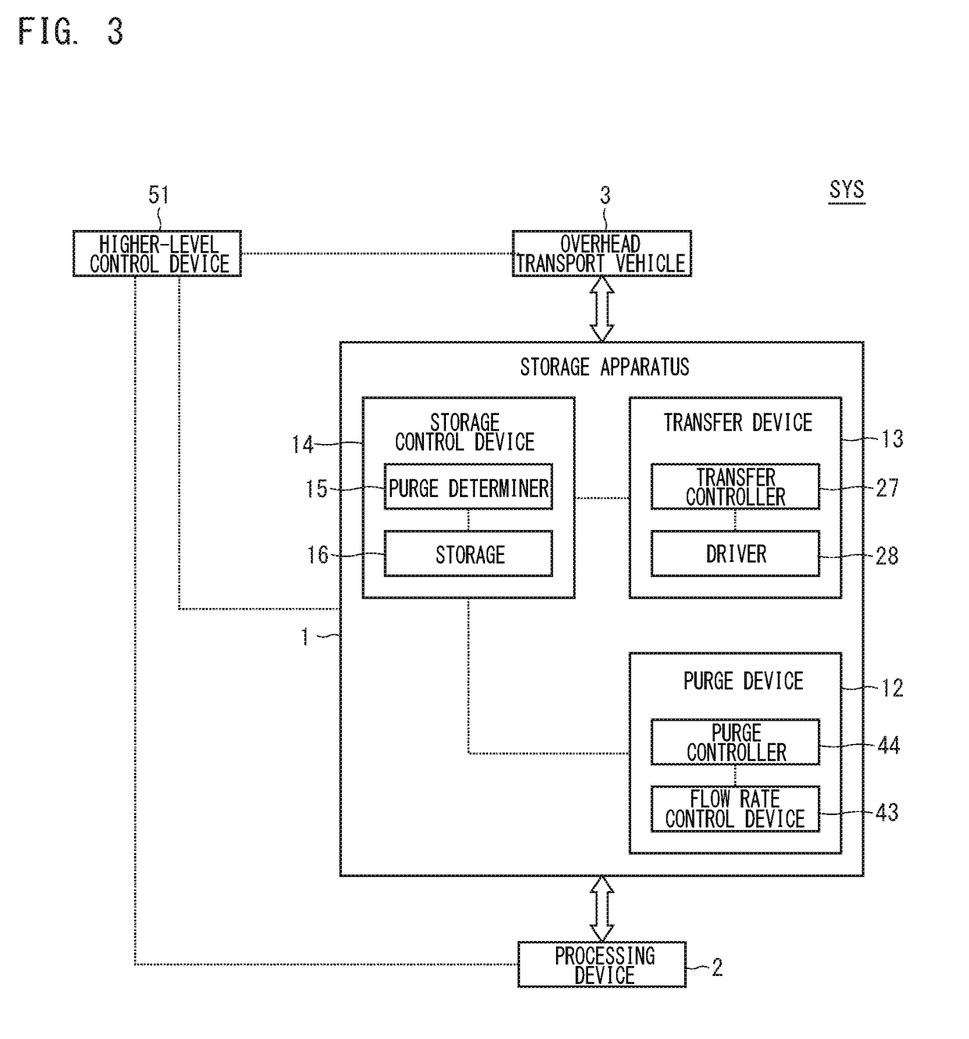
FIG. 3 is a block diagram illustrating a manufacturing system according to a preferred embodiment of the present invention.

The transfer controller 27 controls each of a driver for the horizontal slider 23, a driver for the vertical slider 25, and a driver for the arm 26. In FIG. 3 referred to later, the drivers are denoted by reference symbol 28. The transfer controller 27 is communicably connected to the storage control device 14, and controls the above-mentioned drivers in accordance with a conveyance instruction supplied from the storage control device 14. The conveyance instruction is an instruction that designates a start point and an end point for conveyance of the container F and requests the conveyance of the container F. Note that the transfer device 13 is not limited to the above-mentioned configuration. For example, the transfer device 13 may convey the container F while holding the container F by scooping the bottom surface of the container F.

Figure 2:
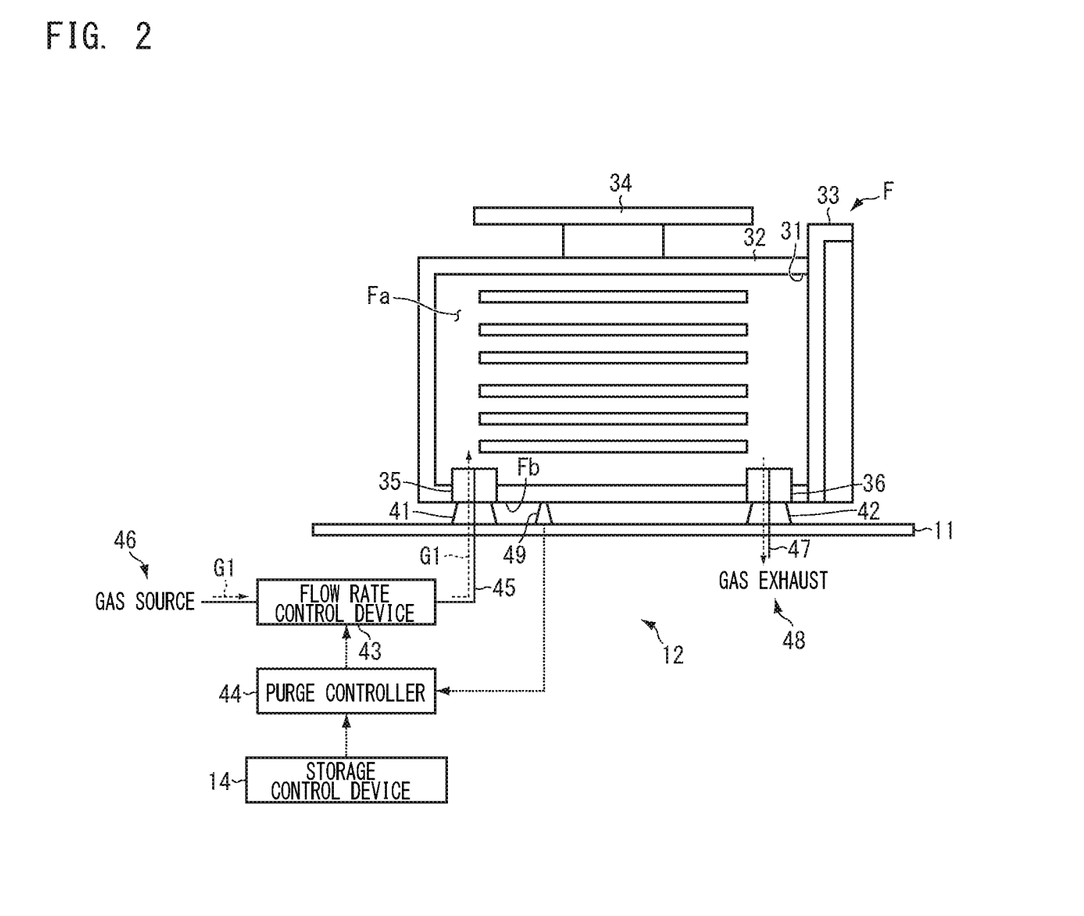
FIG. 2 is a diagram illustrating a purge device according to a preferred embodiment of the present invention.

FIG. 2 is a diagram illustrating the purge device 12. FIG. 2 illustrates FOUP as an example of the container F, but the container F may alternatively be SMIF Pod or reticle Pod, for example. The container F includes a box-shaped main body 32 including an opening 31 in its front surface, and a lid 33 that closes the opening 31. An article such as a wafer is contained in an interior Fa (internal space, containing space) in the container F through the opening 31. A flange 34 is provided on top of the main body 32. The main body 32 includes a positioning recess (not shown) on its bottom surface Fb side. A positioning pin (not shown) is provided on the top surface of the storage shelf 11. When the container F is placed on the storage shelf 11, the pin on the top surface of the storage shelf 11 enters the recess on the bottom surface Fb side of the container F, and the container F is positioned with respect to the storage shelf 11. The main body 32 of the container F has, on the bottom surface Fb side, a gas introduction port 35 and a gas exhaust port 36.

For example, a gas introduction port, a filter, and a check valve are provided in the gas introduction port 35. The gas introduction port communicates with the interior Fa in the main body 32 and the outside. The inside of the gas introduction port is a flow path for a purge gas G1 supplied to the interior Fa in the container F, and the filter is provided in the flow path. The filter is, for example, a particle filter, and removes dust included in the gas passing through the gas introduction port. The check valve in the gas introduction port 35 prevents the gas from flowing out to the outside from the interior Fa in the container F through the gas introduction port. For example, an exhaust port, a check valve, and a filter are provided in the gas exhaust port 36. The exhaust port communicates with the interior Fa in the main body 32 and the outside. The check valve in the gas exhaust port 36 prevents the gas from flowing in the interior Fa from the outside of the container F through the exhaust port. The filter is, for example, a particle filter, and removes dust included in the gas passing through the exhaust port. In the gas passing through the exhaust port, the ratio of atmosphere gas in the interior Fa in the container F before a purge process is high at the timing immediately after the start of the purge process, and the ratio of the purge gas G1 becomes higher as time has elapsed from the start of the purge process.

The purge device 12 is provided to the storage shelf 11 and is able to perform a purge process on the container F. The purge device 12 includes a purge nozzle 41, an exhaust nozzle 42, a flow rate control device 43, and a purge controller 44. The purge nozzle 41 and the exhaust nozzle 42 are provided on the top surface of the storage shelf 11. The purge nozzle 41 and the exhaust nozzle 42 are arranged so as to be connected to the gas introduction port and the exhaust port, respectively, when the container F is placed on the storage shelf 11. When the container F is placed on the storage shelf 11, the gas introduction port in the container F is connected to a pipe 45 through the purge nozzle 41, and is further connected to a gas source 46 through the flow rate control device 43. The exhaust nozzle 42 is connected to an exhaust path (gas exhaust 48) for the purge gas G1 through a pipe 47.

The gas source 46 supplies the purge gas G1. The type of the purge gas G1 is selected depending on matters (articles) contained in the container F. For example, a gas that significantly reduces or prevents oxidation and molecular contamination of contained matters or a gas to reduce moisture inside the container F is preferably used. For example, when the contained matter is a silicon wafer, a gas that is inactive for contained matters such as nitrogen gas is used as the purge gas G1. When nitrogen gas is supplied to the interior Fa in the container F, the atmosphere gas containing oxygen is discharged (removed) to the outside from inside the container F, and the silicon wafer is significantly reduced or prevented from being oxidized. Furthermore, when the contained matter is a reticle, dry gas such as clean dry air (CDA) is used as the purge gas G1. When the clean dry air is supplied to the interior Fa in the container F, the atmosphere gas containing moisture is discharged (removed) to the outside from inside the container F, and moisture is prevented from adhering to the reticle and the contained matter is prevented from being exposed to harmful gas. The gas source 46 may be a part of the storage apparatus 1, or may be a device outside the storage apparatus 1. For example, the gas source 46 may be a part of a facility where the storage apparatus 1 is provided.

To perform a purge process on the container F, the purge gas G1 from the gas source 46 is supplied from the gas introduction port in the container F to the interior Fa through the flow rate control device 43 and the pipe 45, and is filled in the interior Fa in the container F. Furthermore, the gas in the interior Fa is discharged to the outside of the container F through the exhaust port, and is discharged to the outside by the gas exhaust 48 through the pipe 45. Note that the gas exhaust 48 may be provided with a device that sucks the gas with a pump. Furthermore, the container F is not necessarily required to have the gas exhaust port 36, and in this case, the purge device 12 is not necessarily required to have the exhaust nozzle 42. For example, when the pressure in the interior Fa in the container F becomes equal to or higher than a threshold, the gas in the interior Fa in the container F leaks to the outside through a gap between the opening 31 and the lid 33, and hence even when the gas exhaust port 36 is absent, the gas in the interior Fa in the container F is able to be discharged to the outside.

The flow rate control device 43 controls the flow rate of the purge gas G1 in the pipe 45 connected to the container F (flow path between the gas introduction port in the container F and the gas source 46). Examples of the flow rate control device 43 include a mass flow controller. The flow rate control device 43 has a flow path therein through which the purge gas G1 flows. For example, a flowmeter using a self-heat generating resistor and a flow rate control valve such as an electromagnetic valve may be provided in the flow path inside the flow rate control device 43. The flow rate control device 43 performs feedback control of the electromagnetic valve based on the measurement result of the flowmeter, and controls the flow rate of the purge gas G1 inside the flow rate control device 43 to approach a target value. By controlling the flow rate of the purge gas G1 in the pipe 45 by the flow rate control device 43, the flow rate of the purge gas G1 supplied from the gas source 46 to the purge nozzle 41 is controlled. The flow rate control device 43 is communicably connected to the purge controller 44, and controls the flow rate of the purge gas G1 based on a control signal supplied from the purge controller 44.

In the storage shelf 11, a presence/absence sensor 49 (stock sensor) that detects that the container F is placed is provided. The presence/absence sensor 49 is a contact sensor such as a button sensor, and when pressed down by the bottom surface of the container F, detects that the container F is placed on the storage shelf 11. The presence/absence sensor 49 is communicably connected to the purge controller 44, and supplies the detection result to the purge controller 44. The purge controller 44 is communicably connected to the storage control device 14, and controls the flow rate control device 43 in accordance with an instruction supplied from the storage control device 14 to execute a purge process.

FIG. 3 is a block diagram illustrating the manufacturing system SYS according to a preferred embodiment of the present invention. The manufacturing system SYS includes a higher-level control device 51. Examples of the higher-level control device 51 include a manufacturing execution system (MES) and a material control system or a material handling control system (MCS). The higher-level control device 51 performs overall control of the storage apparatus 1, the processing device 2, and the overhead transport vehicle 3. Note that, in FIG. 3, one processing device 2 provided in the manufacturing system SYS is representatively illustrated, but in an actual case, a plurality of processing devices are provided in the manufacturing system SYS, and the higher-level control device 51 controls the processing devices. The higher-level control device 51 supplies a control instruction to the overhead transport vehicle 3 to control the overhead transport vehicle 3 to convey the container F. Furthermore, the higher-level control device 51 supplies a control instruction to the processing device 2 to control the processing device 2 to execute a process. Furthermore, the higher-level control device 51 supplies a control instruction to the storage apparatus 1 to control the storage apparatus 1 to transfer the container F to and from the overhead transport vehicle 3 and transfer the container F to and from the processing device 2. The storage control device 14 in the storage apparatus 1 supplies a conveyance instruction to the transfer controller 27 in the transfer device 13 to control the transfer device 13 to convey the container F based on a control instruction from the higher-level control device 51.

In some cases, a container F to be transferred to the processing device 2 or a container F to be received from the processing device 2 does not need to be subjected to a purge process by the purge device 12 in the storage apparatus 1. For example, the container F may need to be subjected to the purge process before being processed by the processing device 2, but the container F does not need to be subjected to the purge process when the processed article is conveyed. In such cases, the purge process is necessary for the container F to be transferred to the processing device 2, but the purge process for the container F to be received from the processing device 2 is unnecessary. Thus, if the purge process is performed on a corresponding container F after the process, the cost and time are wasted. As a solution, in the storage apparatus 1, the purge determiner 15 determines the necessity of the purge process in accordance with at least one of a transport source of the container F to the storage shelf 11 and a transport destination of the container F from the storage shelf 11. Furthermore, the storage control device 14 controls the purge device 12 to execute a purge process for a container F for which the purge determiner 15 determines that the purge process is necessary, and controls the purge device 12 not to execute a purge process for a container F for which the purge determiner 15 determines that the purge process is unnecessary.

Note that there may be no problem if the amount of supply of a purge gas in a purge process by the purge device 12 in the storage apparatus 1 is small for a container F to be transferred to the processing device 2 or a container F to be received from the processing device 2. For example, the purge process may be necessary for both the container F to be transferred to the processing device 2 and the container F to be received from the processing device 2, but the container F to be transferred to the processing device 2 has been subjected to the purge process in advance before being conveyed to the storage apparatus 1, and thus it is only necessary to perform the purge process by the storage apparatus 1 by the amount by which the purge gas has escaped during the conveyance. As a solution, the purge determiner 15 may determine the condition of the purge process in accordance with at least one of a transport source of the container F to the storage shelf 11 and a transport destination of the container F from the storage shelf 11. Examples of the conditions for the purge process include the flow rate of the purge gas and the supply time of the purge gas.

The purge determiner 15 determines the necessity of the purge process based on a conveyance instruction for the transfer device 13 between the loading and unloading port 6 or 7 and the storage shelf 11 or a conveyance instruction for the transfer device 13 between the load port 4 or 5 and the storage shelf 11. Here, when the conveyance instruction is an instruction to convey the container F from the loading and unloading port 6 to the storage shelf 11, the container F is transferred to the processing device 2 after being temporarily stored, and hence the container F contains therein the article before being processed by the processing device 2. Furthermore, when the conveyance instruction is an instruction to convey the container F from the load port 5 to the storage shelf 11, it means that the container F contains therein an article that has been processed by the processing device 2. The necessity of a purge process for an article before being processed by the processing device 2 and the necessity of a purge process for an article after being processed by the processing device 2 are known in advance depending on the kind of process of the processing device 2, and hence the necessity of the purge process is determined based on the conveyance instruction. The purge determiner 15 specifies a transport source and a transport destination of the container F based on the conveyance instruction, and collates the result with reference information. The reference information is information in which the transport source and the necessity of the purge process are associated with each other or information in which the transport destination and the necessity of the purge process are associated with each other. The reference information is stored in the storage 16, and the purge determiner 15 determines the necessity of the purge process by collating the result of specifying the transport source or the transport destination with the reference information acquired from the storage 16.

Figure 4A:
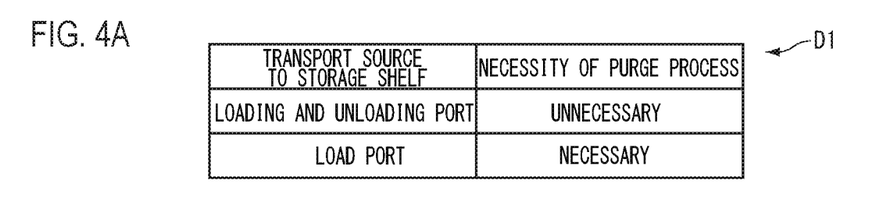
FIGS. 4A to 4D are diagrams illustrating reference information according to a preferred embodiment of the present invention.

FIGS. 4A to 4D include diagrams illustrating examples of the reference information according to a preferred embodiment of the present invention. Reference information D1 in FIG. 4A is table data in which the transport source to the storage shelf 11 and the necessity of the purge process are associated with each other. Here, it is assumed that the purge process is unnecessary before the process by the processing device 2, and the purge process is necessary after the process by the processing device 2. In the reference information D1, when the item of "transport source to storage shelf" is "loading and unloading port", this container F corresponds to the one before being processed by the processing device 2, and hence the item of "necessity of purge process" is "unnecessary". Furthermore, when the item of "transport source to storage shelf" is "load port", this container F corresponds to the one after being processed by the processing device 2, and hence the item of "necessity of purge process" is "necessary".

Figure 4B:
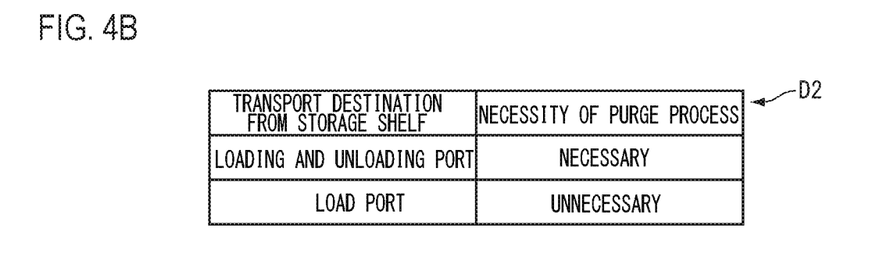

Furthermore, as illustrated in reference information D2 in FIG. 4B, table data in which the transport destination from the storage shelf 11 and the necessity of the purge process are associated with each other may be used. In the reference information D2, when "transport destination from storage shelf" is "loading and unloading port", "transport source to storage shelf" corresponds to "load port" in the reference information D1, and hence the item of "necessity of purge process" is "necessary". Furthermore, in the reference information D2, when "transport destination from storage shelf" is "load port", "transport source to storage shelf" corresponds to "loading and unloading port" in the reference information D1, and hence the item of "necessity of purge process" is "unnecessary".

Figure 4C:
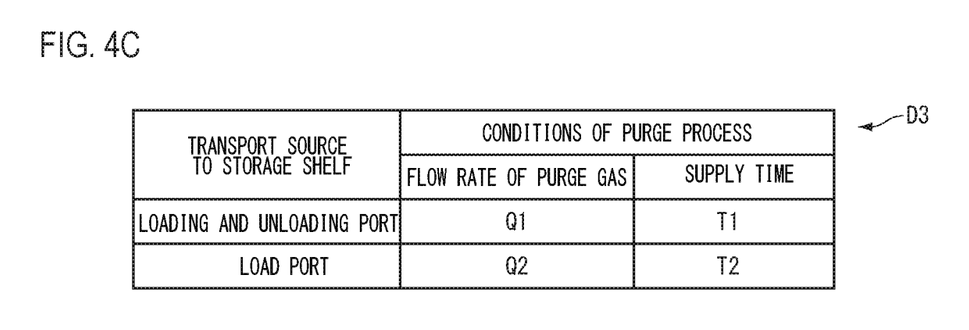

Reference information D3 in FIG. 4C is table data in which the transport source to the storage shelf 11 and the conditions for the purge process are associated with each other. Here, the conditions of the purge process are the flow rate and the supply time of a purge gas. When "transport source to storage shelf" is "loading and unloading port", "flow rate of purge gas" and "supply time" in "conditions for purge process" are "Q1" and "T1", respectively. Furthermore, when "transport source to storage shelf" is "load port", "flow rate of purge gas" and "supply time" in "conditions for purge process" are "Q2" and "T2", respectively. Here, for the container F corresponding to the one before being processed by the processing device 2, the degree of the purge process may be lower (a smaller amount of supply of purge gas) than that for the container F corresponding to the one after being processed. For the container F corresponding to the one before being processed, "transport source to storage shelf" is "loading and unloading port". For the container F corresponding to the one after being processed, "transport source to storage shelf" is "load port". Thus, Q1 is set to be smaller than Q2, or T1 is set to be shorter than T2. Note that, instead of using "necessity of purge process" in FIG. 4A, "condition of purge process" may be used to indicate the necessity of the purge process. For example, the fact that the purge process is unnecessary may be indicated by setting at least one of "flow rate of purge gas" and "supply time" to 0.

Figure 4D:
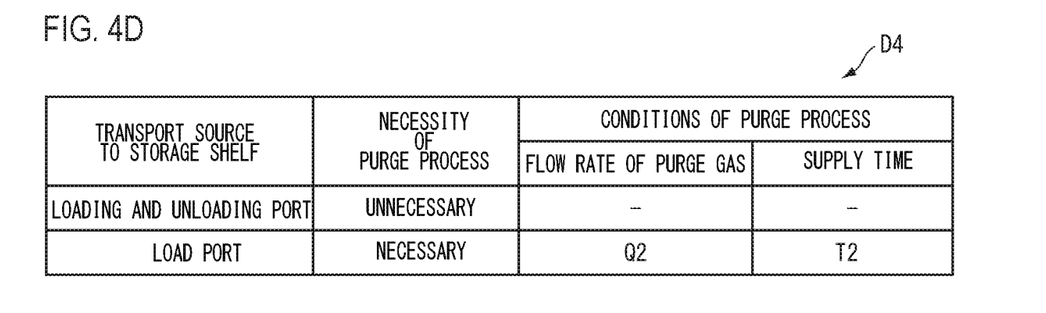

Reference information D4 in FIG. 4D is table data in which the transport source to the storage shelf 11 and the necessity of the purge process and the conditions therefor are associated with each other. When "transport source to storage shelf" is "loading and unloading port", "necessity of purge process" is "unnecessary", and "flow rate of purge gas" and "supply time" in "conditions for purge process" are each "0". Furthermore, when "transport source to storage shelf" is "load port", "necessity of purge process" is "necessary", and "flow rate of purge gas" and "supply time" in "conditions for purge process" are "Q2" and "T2", respectively.

Figure 5A:
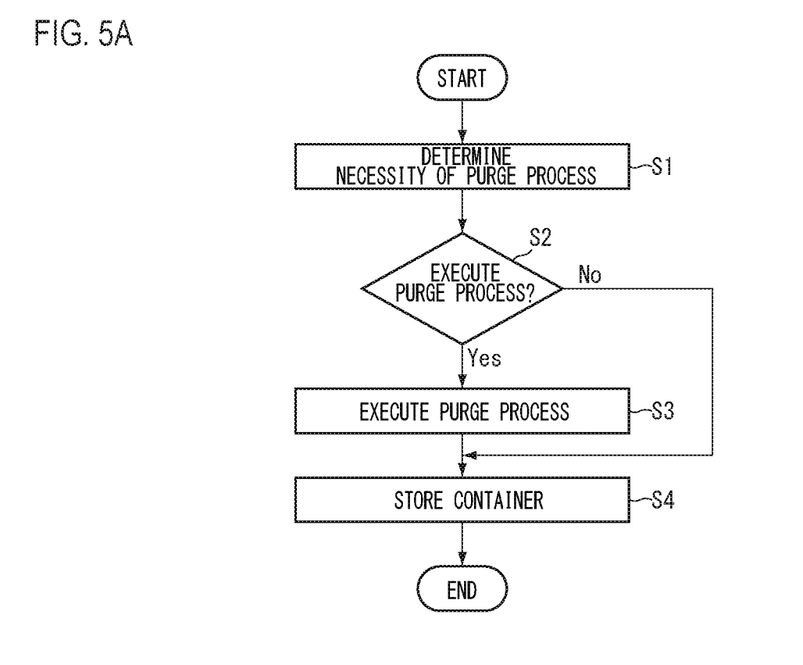
FIGS. 5A and 5B are flowcharts illustrating a purge method according to a preferred embodiment of the present invention.
Figure 5B:
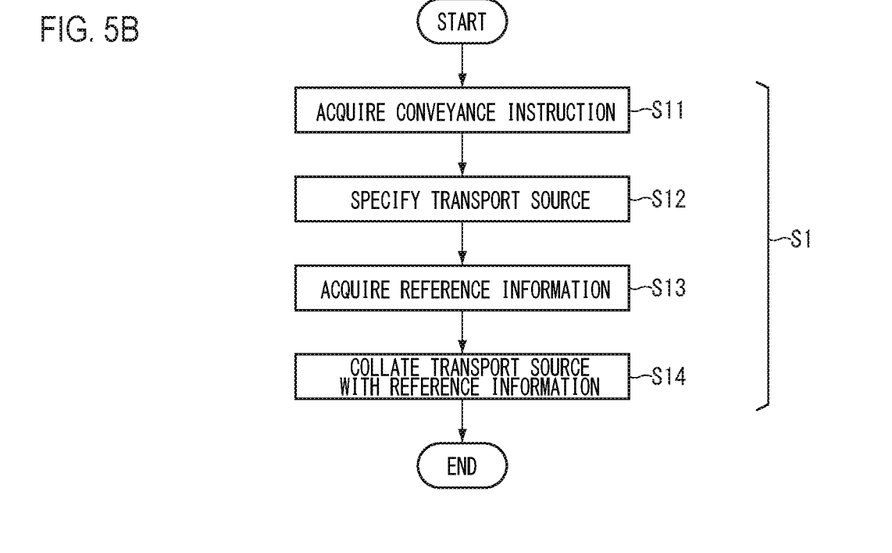

Next, a purge method according to a preferred embodiment of the present invention is described based on the operation of the above-mentioned storage apparatus 1. FIG. 5A is a flowchart illustrating the purge method according to the present preferred embodiment. FIG. 5B is a flowchart illustrating an example of processing of Step S1 in FIG. 5A. At Step S1 in FIG. 5A, the purge determiner 15 determines the necessity of a purge process. As illustrated in FIG. 5B, at Step S11 in Step S1, the purge determiner 15 acquires a conveyance instruction for the transfer device 13. Furthermore, at Step S12, the purge determiner 15 specifies a transport source of the container F to the storage shelf 11 based on the acquired conveyance instruction. Furthermore, at Step S13, the purge determiner 15 acquires reference information (see FIGS. 4A to 4D) from the storage 16, and at Step S14, determines the necessity of the purge process by collating the transport source of the container F to the storage shelf 11 with the reference information.

Next, at Step S2 in FIG. 5A, the storage control device 14 determines whether to execute the purge process. When the purge determiner 15 determines that the purge process is necessary, the storage control device 14 determines to execute the purge process (Yes at Step S2), and at Step S3, supplies a control instruction that requests the execution of the purge process to the purge controller 44, thus executing the purge process. Furthermore, when the purge determiner 15 determines that the purge process is unnecessary, the storage control device 14 determines not to execute the purge process (No at Step S2). After the processing of Step S4 or when it is determined not to execute the purge process (No at Step S2), the storage apparatus 1 stores the container F in the storage shelf 11.

In the above-mentioned preferred embodiment, the storage control device 14 includes, for example, a computer system that is configured or programmed to define or include the purge determiner 15 and the storage 16. The storage control device 14 reads a computer program stored in the storage 16, and executes various kinds of processing in accordance with the control program. For example, the control program causes a computer to execute control including: storing a container F in the storage shelf 11; performing a purge process on the container F by the purge device 12 provided to the storage shelf 11; and determining at least one of a necessity of the purge process and a condition of the purge process in accordance with at least one of a transport source of the container F to the storage shelf 11 and a transport destination of the container F from the storage shelf 11. The computer program may be provided in a state of being recorded in a computer readable storage medium.

Note that, in the above-mentioned preferred embodiment, the purge determiner 15 determines the necessity of a purge process in accordance with a conveyance instruction for the transfer device 13, but may determine the necessity of a purge process based on other information. For example, the storage apparatus 1 may acquire information on a container F from the higher-level control device 51 or the processing device 2, and determine the necessity of a purge process based on the acquired information. Examples of the information on the container F include information on the kind of articles contained in the container F and stages of the process that are associated with an individual ID of the container F. As far as permitted by the applicable law, the contents of Japanese Patent Application No. 2015-168594 and all the documents cited in the above-mentioned preferred embodiments are incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage apparatus comprising:
    a storage shelf that stores a container;
    a loading and unloading port at which the container is received from and transferred to outside of the storage apparatus;
    a load port at which the container is received from and transferred to a processing device that processes an article contained in the container;

a purge device that is provided to the storage shelf and is able to perform a purge process on the container;

a storage that stores reference information that includes:
first information in which each of a plurality of transport source locations of the container to the storage shelf is associated with a necessity of the purge process on the container at the storage shelf and a condition of the purge process on the container at the storage shelf, and second information in which each of a plurality of transport destination locations of the container from the storage shelf is associated with the necessity of the purge process on the container at the storage shelf and the condition of the purge process on the container at the storage shelf; and a controller that defines and functions as a purge determiner that determines the necessity of the purge process on the container at the storage shelf and the condition of the purge process on the container at the storage shelf by collating the reference information stored in the storage with a specified transport source location of the container to the storage shelf included in the plurality of transport source locations and a specified transport destination location of the container from the storage shelf included in the plurality of transport destination locations; wherein the plurality of transport source locations include at least the loading and unloading port; and the plurality of transport destination locations include at least the load port.

2. The storage apparatus according to claim 1, further comprising a loading and unloading device that carries the container into the storage shelf and carries out the container from the storage shelf; wherein the purge determiner determines the necessity of the purge process in accordance with a conveyance instruction to the loading and unloading device.

3. The storage apparatus according to claim 2, wherein the storage apparatus is provided beside the processing device, and stores, in the storage shelf, the container to be transferred between a transport vehicle port to which the container is transferred from a transport vehicle and the load port in the processing device; and the purge determiner determines the necessity of the purge process based on the conveyance instruction for the loading and unloading device between the transport vehicle port and the storage shelf or the conveyance instruction for the loading and unloading device between the load port and the storage shelf.

4. The storage apparatus according to claim 3, wherein, when the conveyance instruction is an instruction to convey the container from the transport vehicle port to the storage shelf, the purge determiner specifies the specified transport source location as the transport vehicle port.

5. The storage apparatus according to claim 3, wherein, when the conveyance instruction is an instruction to convey the container from the transport vehicle port to the storage shelf, the purge determiner specifies the specified transport destination location as the load port.

6. The storage apparatus according to claim 3, wherein, when the conveyance instruction is an instruction to convey the container from the load port to the storage shelf, the purge determiner specifies the specified transport source location as the load port.

7. The storage apparatus according to claim 3, wherein, when the conveyance instruction is an instruction to convey the container from the load port to the storage shelf, the purge determiner specifies the specified transport destination location as the transport vehicle port.

8. A storage method comprising:
storing a container on a storage shelf provided inside a storage apparatus;

receiving and transferring, through a loading and unloading port, the container from and to outside of the storage apparatus;

receiving and transferring, through a load port, the container from and to a processing device that processes an article contained in the container;

performing a purge process on the container by a purge device provided to the storage shelf;

storing reference information that includes:
first information in which each of a plurality of transport source locations of the container to the storage shelf is associated with a necessity of the purge process on the container at the storage shelf and a condition of the purge process on the container at the storage shelf, and second information in which each of a plurality of transport destination locations of the container from the storage shelf is associated with the necessity of the purge process on the container at the storage shelf and the condition of the purge process on the container at the storage shelf; and determining the necessity of the purge process on the container at the storage shelf and the condition of the purge process on the container at the storage shelf by collating the reference information with a specified transport source location of the container to the storage shelf included in the plurality of transport source locations and a specified transport destination location of the container from the storage shelf included in the plurality of transport destination locations; wherein the plurality of transport source locations include at least the loading and unloading port; and the plurality of transport destination locations include at least the load port.

* * * * *